(12) United States Patent
Kawashima

(10) Patent No.: US 7,057,820 B2
(45) Date of Patent: Jun. 6, 2006

(54) PROJECTION OPTICAL SYSTEM

(75) Inventor: Haruna Kawashima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 10/845,832

(22) Filed: May 14, 2004

(65) Prior Publication Data

US 2004/0240071 A1 Dec. 2, 2004

(30) Foreign Application Priority Data

May 14, 2003 (JP) ............................. 2003-135578

(51) Int. Cl.
*G02B 1/10* (2006.01)

(52) U.S. Cl. ................. 359/586; 359/587; 359/581
(58) Field of Classification Search ........... 359/586, 359/587, 581, 603; 355/53
See application file for complete search history.

(56) References Cited

U.S. PATENT DOCUMENTS

2005/0095539 A1 * 5/2005 Tsujita ................. 430/322
2005/0225737 A1 * 10/2005 Weissenrieder et al. ...... 355/53

FOREIGN PATENT DOCUMENTS

| EP | 0 994 368 A2 | 4/2000 |
| JP | 2000-357654 | 12/2000 |
| JP | 2001-004803 | 1/2001 |

OTHER PUBLICATIONS

English Abstract for Japanese Patent Laid Open Application No. 2001-004803.
Taiwanese Office Action with English Translation mailed Dec. 15, 2004.

* cited by examiner

*Primary Examiner*—Fayez G. Assaf
(74) *Attorney, Agent, or Firm*—Morgan & Finnegan, LLP

(57) ABSTRACT

A projection optical system that projects a pattern on a first surface onto a second surface, and has a numerical aperture of 0.85 or higher includes an optical element, and an antireflection coating applied to the optical element, the antireflection coating including plural layers, an end layer having a refractive index of $\tan\{\sin^{-1}(NA)\}$ or greater, where NA is the numerical aperture of the projection optical system.

11 Claims, 17 Drawing Sheets

PROJECTION OPTICAL SYSTEM

This application claims a benefit of foreign priority based on Japanese Patent Application No. 2003-135578, filed on May 14, 2003, which is hereby incorporated by reference herein in its entirety as if fully set forth herein.

BACKGROUND OF THE INVENTION

The present invention relates generally to a projection optical system, and more particularly to a projection optical system with a high numerical aperture ("NA") used to expose an object, such as a single crystal substrate for a semiconductor wafer and a glass plate for a liquid crystal display ("LCD").

A reduction projection exposure apparatus has been conventionally employed which uses a projection optical system to project and transfer a circuit pattern on a reticle (or a mask) as a first surface-onto a wafer, etc. as a second surface, to manufacture such a fine semiconductor device as a semiconductor memory and a logic circuit in the photolithography technology. The minimum critical dimension ("CD") to be transferred by the projection exposure apparatus, which is also called a resolution, is proportional to a wavelength of light used for exposure, and inversely proportional to the NA of the projection optical system. The resolution quality is better at shorter wavelengths.

Decreasing the exposure light wavelength and increasing the NA of the projection optical system have been promoted to meet recent demands for finer semiconductor devices. An early exposure apparatus began with a development of a g-line stepper that uses a g-line ultra-high pressure mercury lamp (having a wavelength of about 436 nm) as a light source and includes a projection optical system with a NA of about 0.3, then an i-line stepper that uses an i-line ultra-high pressure mercury lamp (having a wavelength of about 365 nm) as an light source, and a stepper that uses a KrF excimer laser (having a wavelength of about 248 nm) and includes a projection optical system with a NA of about 0.65. Current widespread projection exposure apparatuses replace these steppers with scanners that use a KrF excimer laser and ArF excimer laser (with a wavelength of approximately 193 nm) as a light source and can include a high-NA projection optical system. The currently commercially available projection optical system with the highest NA has a NA=0.8. The stepper is a step-and-repeat exposure apparatus that moves a wafer stepwise to an exposure area for the next shot for every shot of the cell projection onto the wafer. The scanner is a step-and-scan exposure apparatus that exposes a mask pattern onto a wafer by continuously scanning the wafer relative to the mask, and by moving, after the exposure shot, the wafer stepwise to the next exposure area to be shot.

Scanners that use $F_2$ laser (with a wavelength of approximately 157 nm) as a light source as well as the KrF and ArF excimer lasers and include a projection optical system with NA=0.85 have been extensively studied. There is demand for the development of a projection optical system with NA of 0.90.

With such a development of the projection optical system, an antireflection coating has been developed for applications of an optical element in the projection optical system. The applied antireflection coating technology for the visual light used for conventional cameras, etc. can develop an antireflection coating without any significant problem to an exposure apparatus that uses a g-line ultra-high pressure mercury lamp as a light source. A design of an antireflection coating for the exposure apparatus that uses the g-line ultra-high pressure mercury lamp is almost applicable to an exposure apparatus that uses an i-line ultra-high pressure mercury lamp although some coating materials are unsuitable for the antireflection coating due to optical absorptions.

No high index materials (with a refractive index of about 2.0 or higher) are proposed which have excellent transmission characteristics for light having a wavelength of 300 nm or smaller (or an excellent transmittance) for exposure apparatuses that uses KrF and ArF excimer lasers as a light source. Therefore, antireflection coating materials are limited to low index materials (with a refractive index of 1.4 to 1.45), such as $SiO_2$ and $MgF_2$, and middle index materials (with a refractive index of about 1.6), such as $Al_2O_3$ and $LaF_3$. It is very difficult to develop the antireflection coating due to problems of a design of the coating and control over the coating thickness.

The improved multilayer design technology for the antireflection coating associated with computer developments has solved the coating design problem, and provided conventionally acceptable design values to antireflection coatings made of the low and middle index materials. Since this configuration replaces a coating layer that to be originally made from a high index material, with a coating layer made of the low and middle index materials to form an equivalent coating layer, the designed coating thickness is smaller than that of the antireflection coating in the exposure apparatuses that use g-line and i-line as a light source.

One solution for the problem of control over the coating thickness is the newly proposed coating thickness monitoring using a quarts resonator in addition to the conventionally used optical monitoring of the coating thickness. The sputtering coating formation has been established which is superior to the vacuum evaporation coating formation in controlling coating thickness and coating quality uniformity.

Currently, an antireflection coating having excellent reflective characteristics of up to NA=0.8 can be designed and manufactured (see, for example, Japanese Patent Applications, Publication Nos. 2001-4803 and 2000-357654).

However, an exposure apparatus that uses a $F_2$ laser as a light source cannot use an oxide as a coating material since oxygen strongly absorbs the light having a wavelength near 157 nm, and has the limited coating materials, for example, low index materials (with a refractive index of about 1.4 to 1.55), such as $MgF_2$ and $AlF_3$, and middle index materials (with a refractive index of about 1.70 to 1.75), complicating the design and manufacture of the antireflection coating.

In addition, a transmission loss increases or the transmittance lowers due to optical absorptions by the antireflection coating in a wave range of the ArF excimer laser and $F_2$ laser. A conventionally negligible transmission loss in a coating layer becomes problematic due to light scattering in a wave range of the $F_2$ laser, lowering the throughput and deteriorating the resolution.

As discussed, a design and manufacture of the antireflection coating pose no problem in developing a projection optical system with NA=0.8, whereas it becomes difficult to design and manufacture the antireflection coating having excellent reflective characteristics when the NA becomes 0.85 or higher. As a result, it is unable to provide a projection optical system that has both an NA of 0.85 or greater and excellent optical performance.

BRIEF SUMMARY OF THE INVENTION

Accordingly, it is an exemplary object of the present invention to provide a novel and high-NA projection optical system that has excellent optical performance, such as a throughput and a resolution.

A projection optical system of one aspect according to the present invention that projects a pattern on a first surface onto a second surface, and has a numerical aperture of 0.85 or higher, the projection optical system includes an optical element, and an antireflection coating applied to the optical element, the antireflection coating including plural layers, an end layer having a refractive index of $\tan\{\sin^{-1}(NA)\}$ or greater, where NA is the numerical aperture of the projection optical system., A projection optical system of another aspect according to the present invention that projects a pattern on a first surface onto a second surface, and has a numerical aperture of 0.85 or higher includes plural optical elements that include a final optical element closest to the second surface; and an antireflection coating applied to the final optical element, the antireflection coating having an average reflectance of 2.5% or smaller to incident p-polarized light and s-polarized light. A projection optical system of another aspect according to the present invention that projects a pattern on a first surface onto a second surface, and has a numerical aperture of 0.90 or higher includes plural optical elements that include a final optical element closest to the second surface, and an antireflection coating applied to the final optical element, the antireflection coating having an average reflectance of 3.5% or smaller to incident p-polarized light and s-polarized light.

The refractive index is, for example, 1.6 or greater. The optical element is a light-transmitting element, such as a lens, a diffraction grating, a prism or a seal. The optical element may be the closest to the second surface in the projection optical system.

An exposure apparatus of another aspect according to the present invention includes the above projection optical system and exposes an object by irradiating light onto the object through the projection optical system. The light may have a wavelength, for example, of 250 nm or smaller.

An exposure method according to another aspect according to the present invention for exposing an object using an exposure apparatus that includes a projection optical system with a numerical aperture of 0.85 or higher includes the step of forming a multilayer on the object, said multilayer including a photoresist layer, and the multilayer having an uppermost layer having a refractive index of $\tan\{\sin^{-1}(NA)\}$ or higher, or the multilayer having an uppermost layer having an average reflectance of 10% or smaller to incident p-polarized light and s-polarized light, and exposing the object using the exposure apparatus. The uppermost layer is, for example, the resist layer or a light-transmitting layer.

A device fabrication method of another aspect of this invention includes the steps of exposing a plate by using the above exposure apparatus, and performing a predetermined process for the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
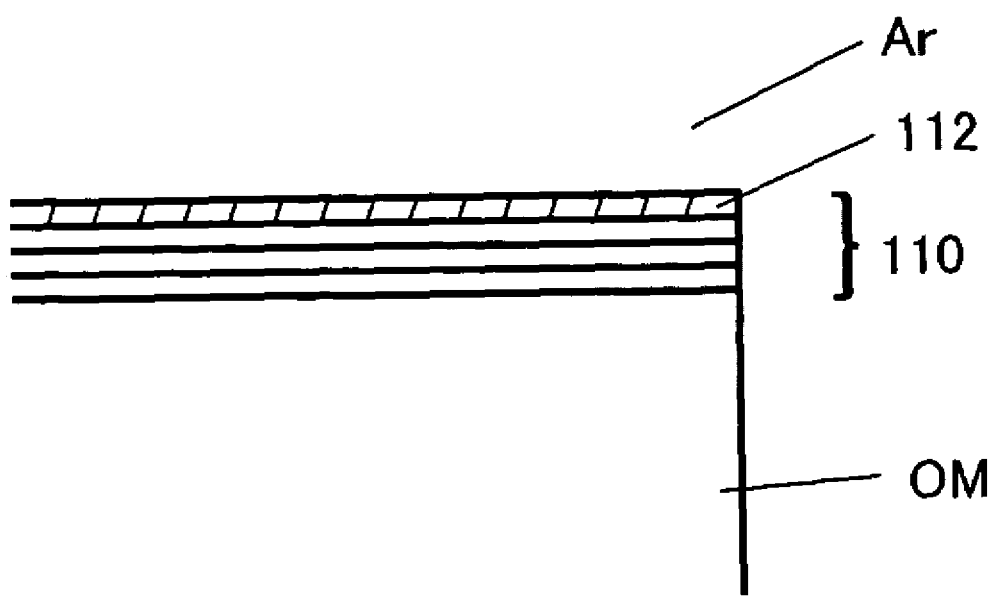
FIG. 1 is a schematic sectional view of an antireflection coating of one aspect according to the present invention.

With reference to the accompanying drawings, a description will now be given of an antireflection coating and photoresist of one exemplary aspect according to the present invention. In each figure, the like element is designated by the similar reference numeral, and a duplicate description will be omitted.

As a result of studies of the antireflection coating to provide the novel and high NA projection optical system having excellent optical performance, such as a throughput and a resolution, the instant inventor has discovered that even when the CAD technology increases the number of layers in the antireflection coating, the reflectance drastically increases from an incident angle near 55° because of the incident angle dependency of the antireflection coating.

Figure 3:
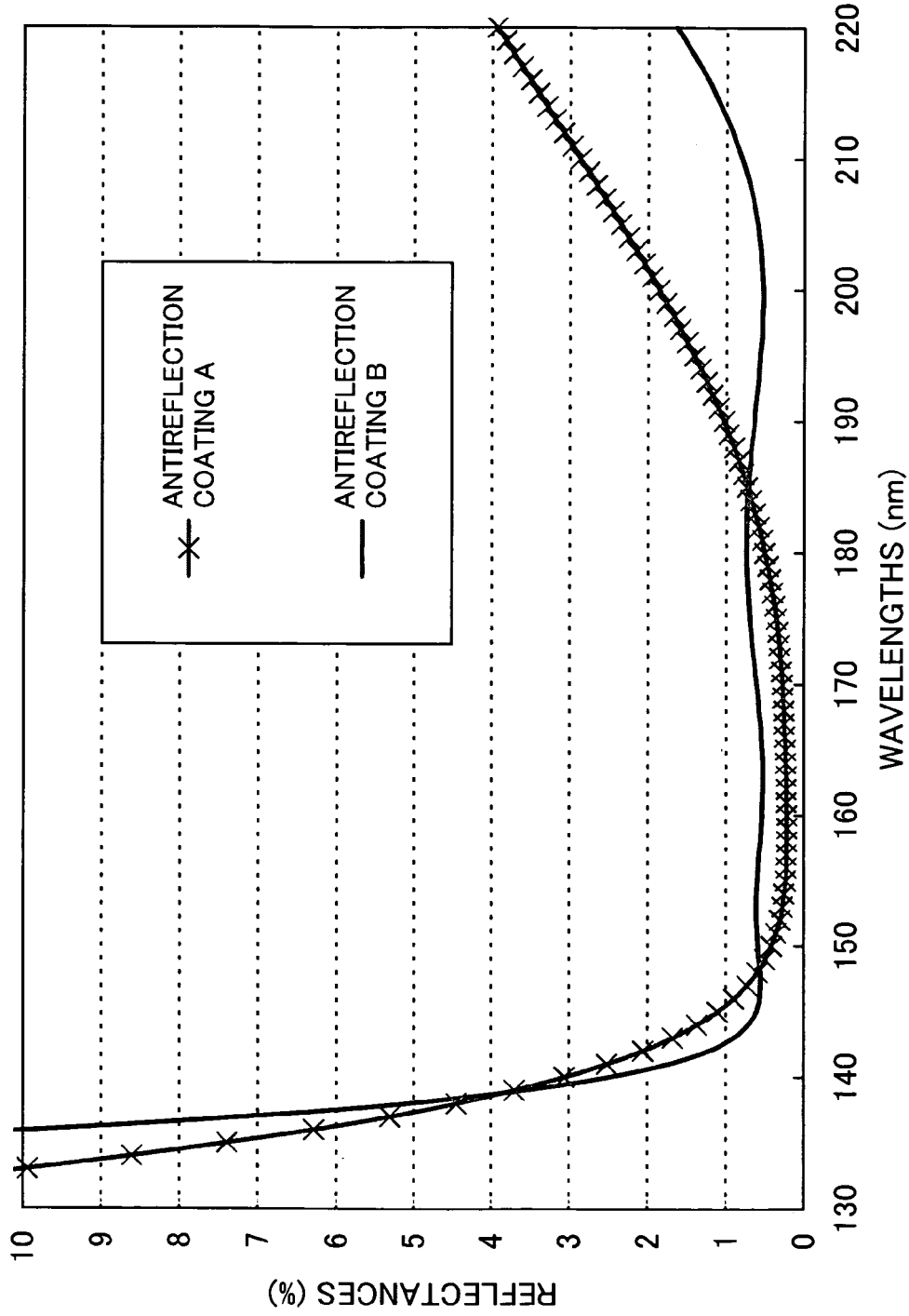
FIG. 3 is a graph showing reflectance characteristics of antireflection coatings A and B to different wavelengths of light.

FIG. 3 shows reflectance characteristics of the antireflection coatings A and B to different wavelength of light. In FIG. 3, an abscissa is the light's wavelengths and an ordinate is the reflectances. The antireflection coating A has generally multiple layers, i.e., three layers, as shown in FIG. 3, for reducing the reflectance to the light with an incident angle of nearly 0° down to about 0.2%. However, the antireflection coating A does not consider the reflectance at a large incident angle of the light. The antireflection coating B has a general multiple, i.e., six layers, as shown in FIG. 3, for reducing the reflectance at a large incident angle, by securing such a wide wave range of 70 nm for the reflectance below 1%, although the reflectance to light with an incident angle of nearly 0° is mitigated to about 0.5%.

Figure 4:
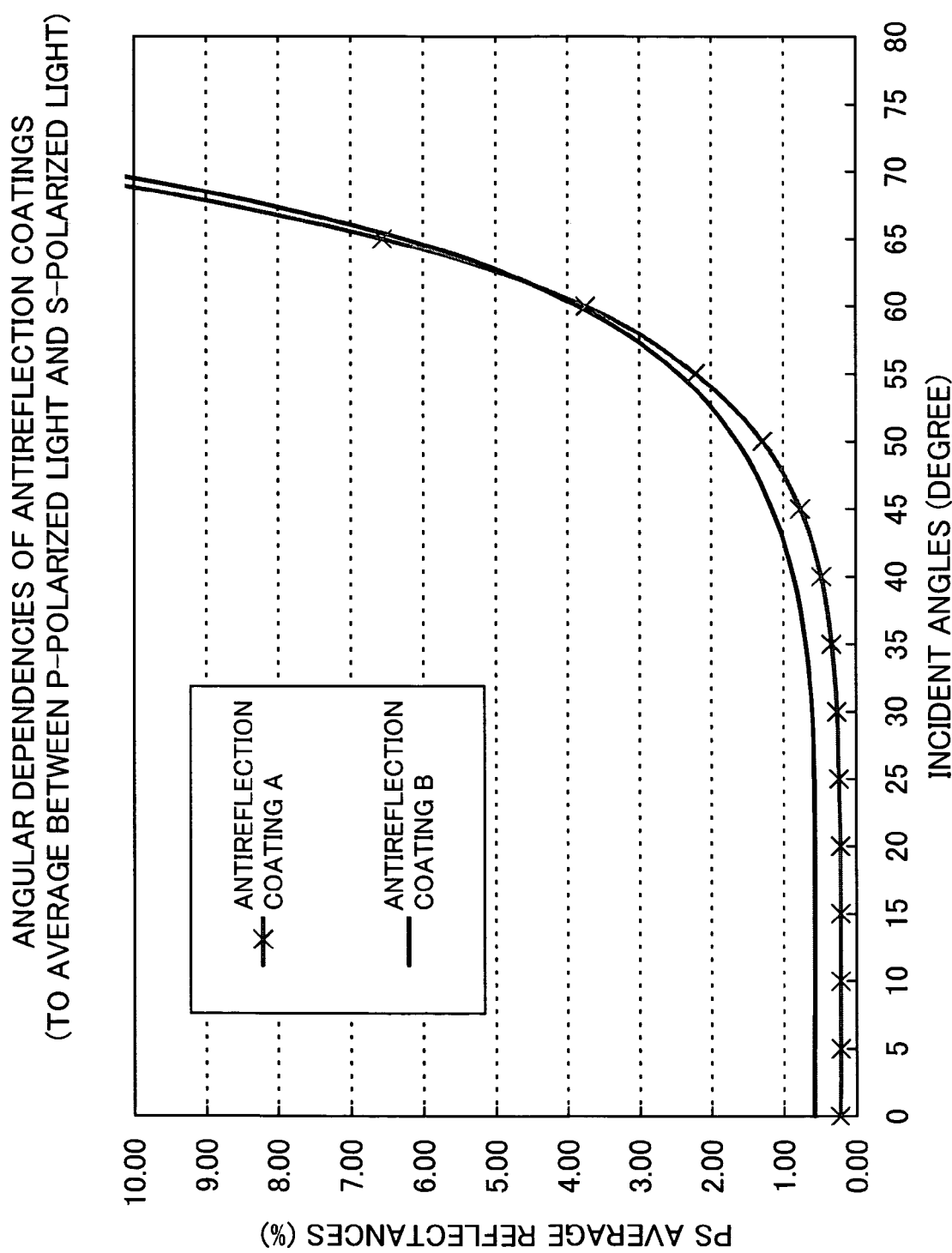
FIG. 4 is a graph showing incident angle dependencies of average reflectances to the p-polarized light and s-polarized light in the antireflection coatings A and B.

FIG. 4 shows the incident angle dependencies of average reflectances to the p-polarized light and the s-polarized light incident upon the antireflection coating A and B shown in FIG. 3. In FIG. 4, an abscissa is the light's incident angles, and an ordinate is an average between the reflectance to the p-polarized light and the reflectance to the s-polarized light. Referring to FIG. 4, the antireflection coating B maintains smaller a difference between the reflectance at an incident angle of 0° and the reflectance at a large incident angle, than the antireflection coating A, but both the antireflection coating A and B similarly increase the reflectances at incident angles of 55° or larger. The reflectance of the antireflection coating B is, for example, 0.2% at an incident angle of 0° (corresponding to a NA of 0), less than 0.5% at an incident angle of 40° (corresponding to a NA of 0.65), less than 1.8% at an incident angle of 53° (corresponding to a NA of 0.80), 3.2% at an incident angle of 58° (corresponding to a NA of 0.85), and 5.5% at an incident angle of 64° (corresponding to a NA of 0.90). This result demonstrates that the antireflection coating B designed to maintain a low reflectance even at large incident angles does not achieve its purpose.

A description will now be given of problems when the reflectance of the antireflection coating drastically increases at incident angles of 55° or greater in a projection optical system with NA of 0.90 (corresponding to 64°). The projection optical system projects a pattern of a reticle (or a mask) as a first surface onto an object (or a substrate, such as a wafer) as a second surface, and includes plural, for example, twenty to thirty, lenses and mirrors. The projection optical system may be a dioptric optical system that includes only plural lenses, or a catadioptric optical system that includes plural lenses and at least one mirror, etc.

The projection optical system has generally a demagnification from four to five times, and has such a high NA of 0.90 at a wafer side that transfers a pattern. Therefore, the incident or exit angle of light that passes through plural lenses should be equivalent to NA=0.90 (corresponding to 64°) or greater at the wafer side in the projection optical system.

Figure 5:
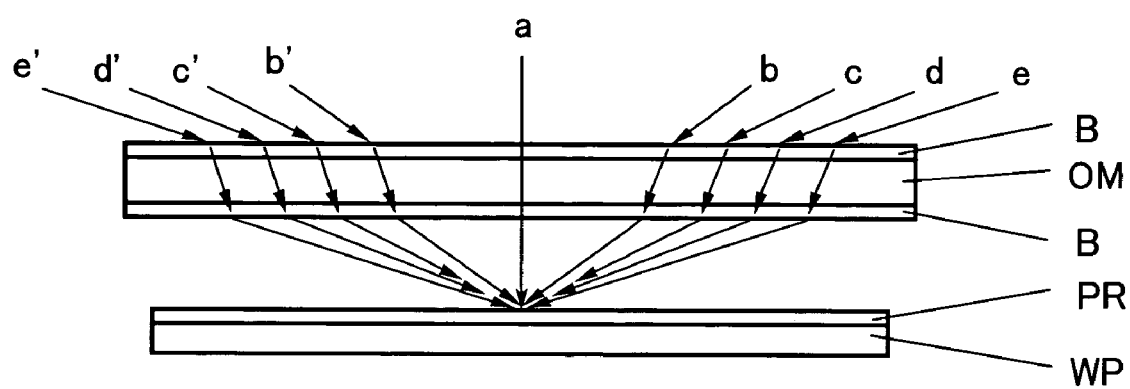
FIG. 5 is a schematic sectional view showing a light-transmitting optical element on a final surface closest to a wafer in a projection optical system.

FIG. 5 shows a schematic sectional view of a light-transmitting optical element OM closest to the wafer side, which forms a final surface in the projection optical surface. To simplify the description, the optical element OM is a seal glass as a parallel plate. Referring to FIG. 5, the antireflection coating B is applied to both surfaces of the light-transmitting optical element OM, and a photoresist PR is applied onto a wafer WP. A ray "a" is one having an incident angle of 0° upon the wafer WP, and rays "b", "c", "d" and "e" are those having incident angles of 40°, 53°, 58° and 60°, respectively, upon the wafer WP. These rays "b", "c", "d" and "e" are those having maximum incident angles corresponding to NAs of 0.65, 0.80, 0.85 and 0.90.

When the projection optical system is a dioptric system (which includes only light-transmitting elements, such as lenses), the ray "a" with an incident angle of 0° upon the wafer WP side (or NA=0) generally passes through the centers of all the lenses in the projection optical system. On the other hand, the ray "e" with an incident angle of 64° upon the wafer WP side (or NA=0.90) forms incident and exit angles equal to or greater than 64° (or NA=0.90) when passing through plural lenses at the wafer WP side in the projection optical system.

For description convenience, the ray "e" with an incident angle of 64° upon the wafer WP side (or NA=0.90) passes through plural (six) lens surfaces at the wafer WP side in the projection optical system with incident and exit angles of 64° (or NA=0.90). Similarly, the rays "d", "c" and "b" with incident angles of 58° (or NA=0.85), 53° (or NA=0.80) and 40° (or NA=0.65) upon the wafer WP side passes through plural (six) lens surfaces with incident and exit angles of 58°, 53° and 40°.

Transmittances of these (totally six) lens surfaces to the rays "a" to "e" are calculated by subtracting the reflectance (%) from 100. According to the reflectance of the antireflection coating B described above with reference to FIG. 4, the total transmittance from the six surfaces to the ray "a" with an incident angle of 0° upon the wafer WP side (or NA=0) is about 99%, since the transmittance per lens is 99.8%. Similarly, the total transmittance from the six surfaces to the ray "b" with an incident angle of 40° upon the wafer WP side (or NA=0.65) is about 97%, since the transmittance per lens is 99.5%. The total transmittance from the six surfaces to the ray "c" with an incident angle of 53° upon the wafer WP side (or NA=0.80) is about 90%, since the transmittance per lens is 98.2%. The total transmittance from the six surfaces to the ray "d" with an incident angle of 58° upon the wafer WP side (or NA=0.85) is about 80%, since the transmittance per lens is 96.8%. The total transmittance from the six surfaces to the ray "e" with an incident angle of 64° upon the wafer WP side (or NA=0.90) is about 70%, since the transmittance per lens is 94.5%.

As discussed, when the reflectance of the antireflection coating drastically increases at the incident or exit angles of 55° (NA=0.82) or greater, the transmittance of the projection optical system that has NA of 0.90 that corresponds to 64° disadvantageously shows different transmittances at different NA values.

When the projection optical system that has different transmittances according to the NA values is used to simultaneously transfer two types of pattern having different pitches on a reticle onto a resist-applied wafer, the transmittance of the projection optical system differs according to the pattern's pitches, because the directions or angles of the diffracted light are different according to the pattern's pitches. This causes the exposure dose to the resist to vary which deteriorates the CD uniformity.

Even for the same pattern pitch, central and peripheral parts on a repetitive pattern generate diffracted light in different directions, causing a difference in optimal exposure dose to the resist between the central part and the peripheral part, and deteriorating the CD uniformity.

The above discussion addresses only the on-axis light (passing through the center of the projected screen) in the projection optical system. A description will be given of the off-axis light (passing through the periphery of the projected screen). The ray "e" with an incident angle of 64° (corresponding to NA=0.90) shown in FIG. 5 and a ray "e'" with an incident angle of –64° (corresponding to NA=0.90) have different incident and exit angles when passing through plural lenses at the wafer WP side in the projection optical system, causing a difference in transmittance in the projection optical system. In other words, there is a difference in light intensity reaching the resist between the ray "e" with an incident angle of 64° (corresponding to NA=0.90) shown in FIG. 5 and the ray "e'" with an incident angle of −64° (corresponding to NA=0.90), and the transferred pattern has an asymmetry, such as a coma.

A difference in transmittance to the projection optical system's NA differs not only according to reticle patterns, but also according to coherence factors σ of illumination light for illuminating the reticle pattern. When the illumination light has a large coherence factor σ, such as σ=0.85, the diffracted light widely spreads with an amount corresponding to the coherence factor σ of the illumination light around a direction or an angle determined by the pattern's pitch. Therefore, the large coherence factor a of the illumination light can smooth and alleviate the influence of a difference in transmittance due to the NA of the projection optical system.

On the other hand, when the illumination light has a small coherence factor σ, such as σ=0.30, or when the illumination light is modified illumination, such as an annular illumination, a quadrupole illumination, and a dipole illumination, the diffracted light spreads narrowly and is subject to a difference in transmittance due to the NA of the projection optical system.

A projection optical system with a NA of 0.85 or higher, allegedly the limits of the photolithography, necessarily utilizes the modified illumination technology and phase shift and halftone masks technology (with a small σ illumination light) to improve the critical resolving power. Therefore, a NA-induced difference in transmittance becomes a more significant problem in the projection optical system with the NA of 0.85 or higher. Although a large σ illumination condition can reduce the CD difference and pattern asymmetry down to several percentages, the illumination conditions with small σ and a modified illumination may possibly cause influence of 20% of the CD difference and pattern asymmetry.

Figure 6:
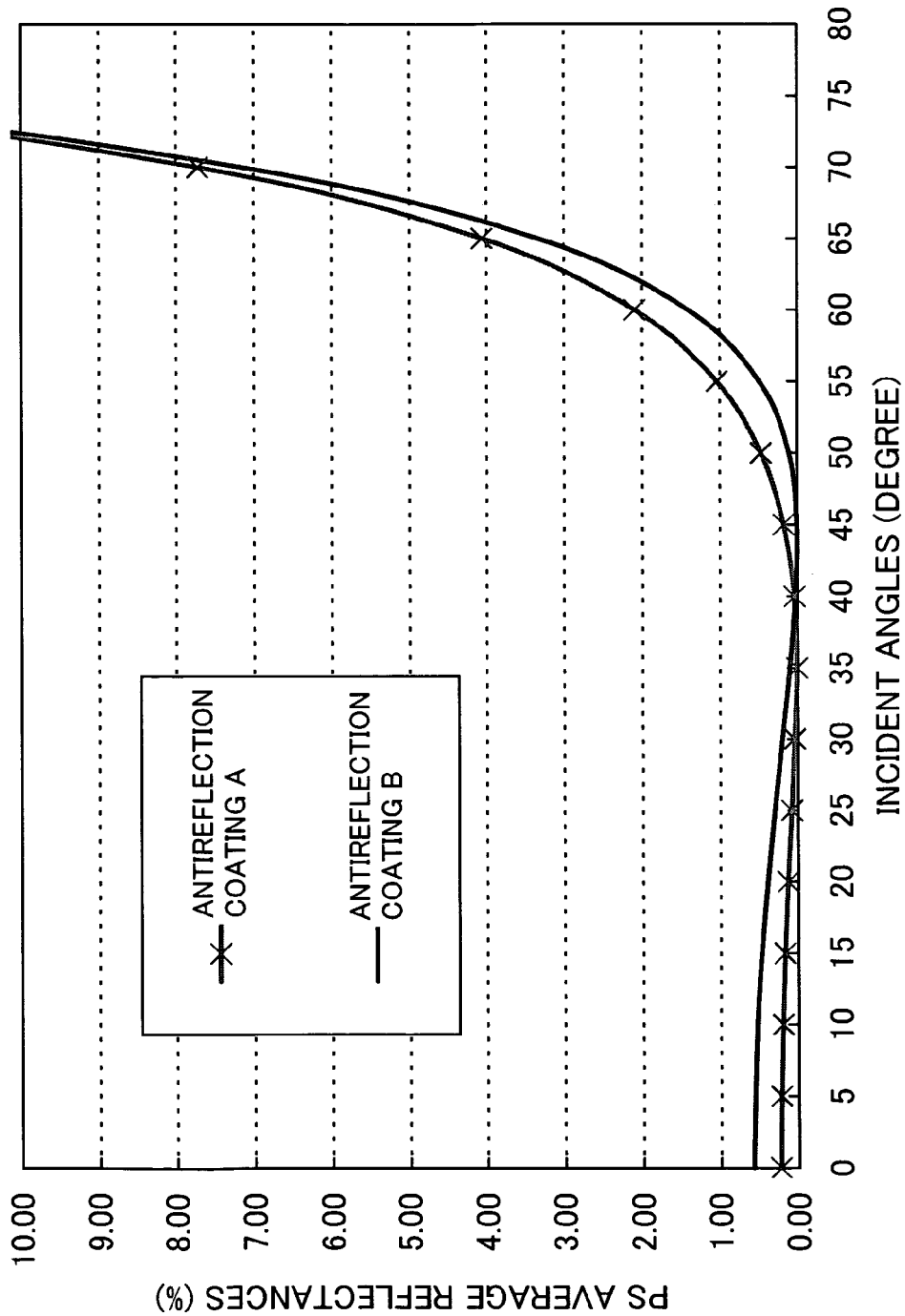
FIG. 6 is a graph of incident angle dependencies of the reflectances to the p-polarized light incident upon the antireflection coatings A and B shown in FIG. 3.
Figure 7:
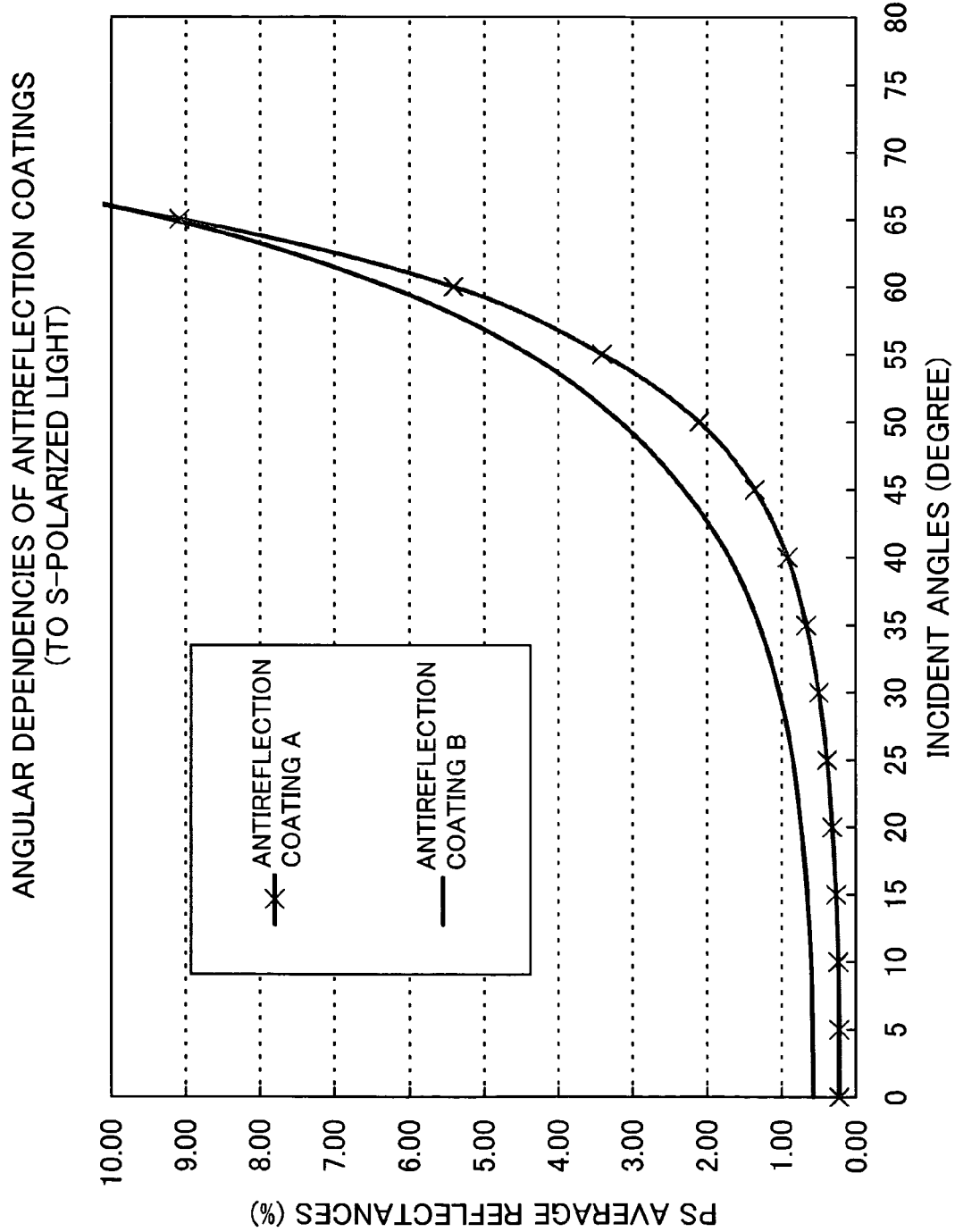
FIG. 7 is a graph of incident angle dependencies of the reflectances to the s-polarized light incident upon the antireflection coatings A and B shown in FIG. 3.

Accordingly, the instant inventor first studied the reasons why the reflectance drastically increases from an incident angle of 55° in the incident angle dependencies of the antireflection coating. FIG. 6 shows incident angle dependencies of reflectances to the p-polarized light incident upon the antireflection coatings A and B shown in FIG. 3. FIG. 7 shows incident angle dependencies of reflectances to the s-polarized light incident upon the antireflection coatings A and B shown in FIG. 3. In FIG. 6, an abscissa is light's incident angles, and an ordinate is the reflectances to the p-polarized light. In FIG. 7, an abscissa is light's incident angles, and an ordinate is the reflectance to the s-polarized light.

Referring to FIG. 6, when the p-polarized light has an incident angle of 0°, the antireflection coating A has a reflectance of about 0.2% and the antireflection coating B has a reflectance of about 0.5%. As the incident angle increases, the reflectance tends to be lower compared to the reflectance at the incident angle of 0°. For example, the antireflection coating A has the reflectance of 0% near the incident angle of 35°, while the antireflection coating B has the reflectance of 0% near the incident angle of 45°.

As the incident angle further increases, the reflectance also increases. For example, the reflectance of the antireflection coating A is 1% near the incident angle of 55°, and the reflectance of the antireflection coating B is 1% near the incident angle of 58°. The reflectance drastically increases near the incident angle of 64° (corresponding to NA=0.90). For example, the reflectances of the antireflection coatings A and B become 4% and 3%, respectively.

On the other hand, referring to FIG. 7, when the s-polarized light has an incident angle of 0°, the antireflection coating A has a reflectance of about 0.2% and the antireflection coating B has a reflectance of about 0.5%. As the incident angle increases, the reflectances of the antireflection coatings A and B tend to simply increase: The antireflection coating A has the reflectance of 1% near the incident angle of 42°, while the antireflection coating B has the reflectance of 1% near the incident angle of 30°. As the incident angle further increases to 64° (corresponding to NA=0.90), the reflectance shows a greater tendency to increase: The reflectances of both the antireflection coatings A and B become about 9%.

According to the above result, the reflectance to increasing incident angles of the s-polarized light characteristically follows a simple increase, and has the larger reflectance to the incident angle than the reflectance to the incident angle of the p-polarized light. On the other hand, the reflectance to increasing incident angles of the p-polarized light characteristically decreases first, and increases significantly beyond a minimum value. The reflectance to the p-polarized light increases more greatly beyond the minimum value than that to the s-polarized light.

Figure 8:
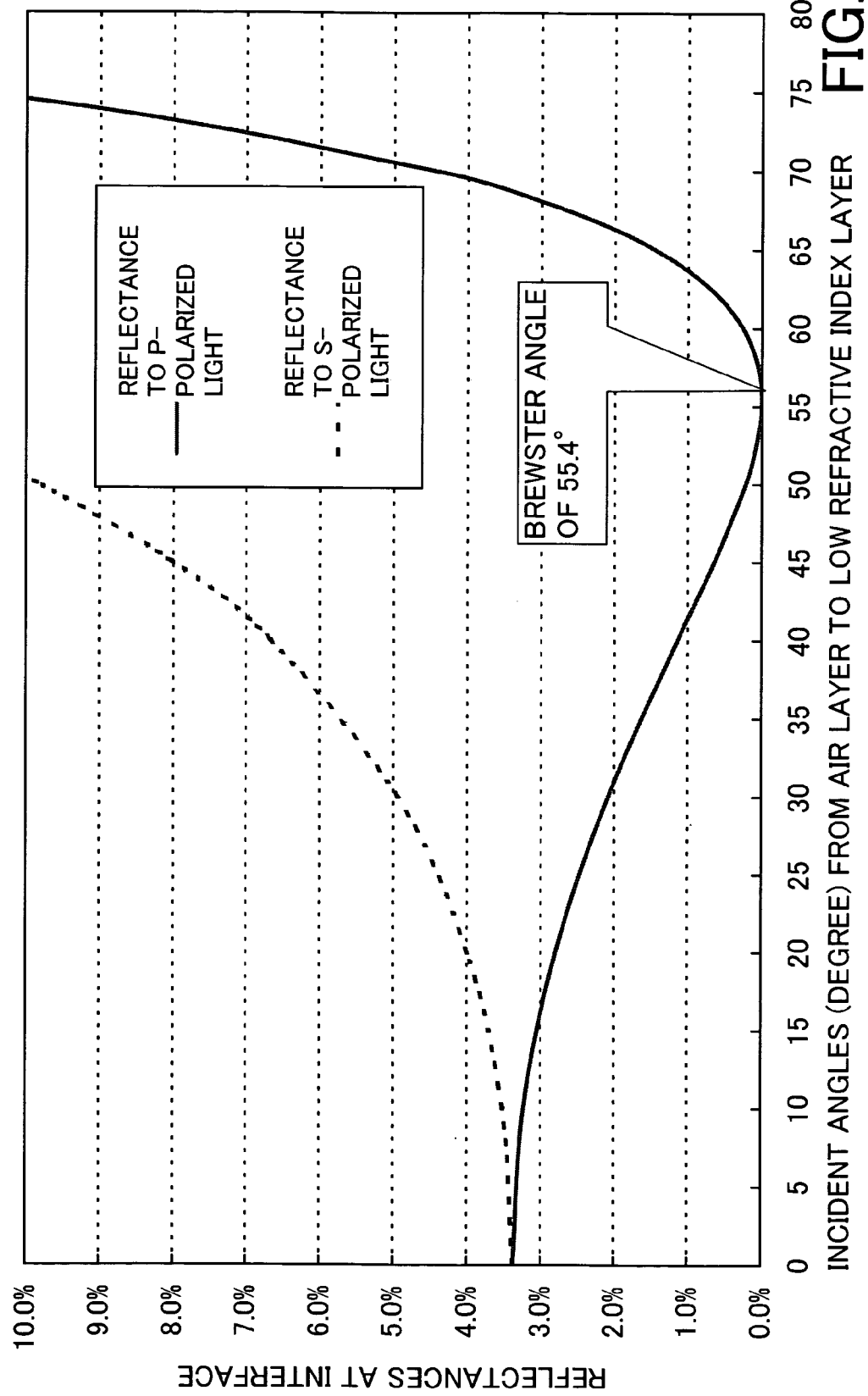
FIG. 8 is a graph showing the reflectances to p-polarized light and s-polarized light when the light enters medium Y with a refractive index of 1.45 from air (medium X).

A description will now be given of studies of a minimum value of the reflectance to the variable incident angle of the p-polarized light. FIG. 8 shows reflectances to p-polarized light and s-polarized light when the light enters medium Y with a refractive index of 1.45 from air (medium X). In FIG. 8, an abscissa is an incident angle of the light entering the low refractive index layer from the air layer, and an ordinate is the reflectance at the interface between the air layer and the low refractive index layer.

Referring to FIG. 8, the behavior of the reflectance to increasing incident angles is similar to those shown in FIGS. 6 and 7. The incident angle when the reflectance to the p-polarized angle is 0° is called a Brewster angle or a polarization angle.

Equation 1 expresses the Brewster angle θ, where n1 and n2 are refractive indexes of the media X and Y:

$$\theta = \tan^{-1}(n2/n1) \tag{1}$$

It is understood from Equation 1 that as a ratio between the refractive indexes of the media X and Y is smaller, the Brewster angle becomes smaller.

A description will now be given of the reason why the antireflection coatings A and B shown in FIG. 6 do not have the same minimum value (or angle of the reflectance to the p-polarized light, although the Brewster angle from the air as a medium X to the medium Y of the refractive index of 1.45 is uniquely determined.

The antireflection coating is a thin film layer made of several layers formed on a substrate glass, such as $SiO_2$ and $CaF_2$. For simplicity purposes, a description will now be given of an example of the antireflection coating of a single layer. The reflection that occurs at an interface between the air and the single layer film, and the reflection that occurs at an interface between the single layer film and a substrate glass cancel out each other at a certain angle due to an optical path length of the single layer film, reducing the reflectance down to around 0%, but do not completely cancel out each other at other angles, leaving the reflectance of, for example, about 1%. It is understood that the antireflection coatings A and B have difference optical path lengths and thus their reflectances to p-polarized light shown in FIG. 6 become 0° at different angles.

It is therefore understood that changing of the thickness of the antireflection coatings A and B can set a minimum value of the reflectance to the p-polarized light to an arbitrary incident angle. Accordingly, a description will now be given of a review of how much the minimum value can be shifted to a larger incident angle.

As discussed, the low index material (with a refractive index between about 1.4 and about 1.55) and middle index material (with a refractive index between about 1.60 and about 1.75) can be used as a material of the antireflection coatings in a range of the KrF excimer laser (with a wavelength of approximately 248 nm), the ArF excimer laser (with a wavelength of approximately 193 nm), and the $F_2$ laser (with a wavelength of approximately 157 nm). In the following description, a thin film layer made of the low index material will be called a low refractive index layer, and a thin film layer made of the middle index material will be called a high refractive index layer.

A conventional design of an antireflection coating generally makes a final layer (or the uppermost layer that contacts the air) of a low refractive index layer. This configuration comparatively facilitates a design of the antireflection film: For example, a low refractive index final layer can decrease reflections at the interface between the final layer and the air, and reduce the reflectance at wide incident angles with a coating having the small number of layers. Therefore, the conventional antireflection film has the following four types of interfaces in addition to the interface between the antireflection coating and the air:

FIGS. 9 to 12 show reflectances to p-polarized light and s-polarized light at four types of interfaces in the antireflection coating. When light with a NA=0.90 (corresponding to an incident angle of 64°) enters the antireflection coating, an incident angle at each interface and the Brewster angle determined at each interface are calculated, where the low refractive index, the high refractive index, the lens plate are set to 1.45, 1.75 and 1.50.

Figure 9:
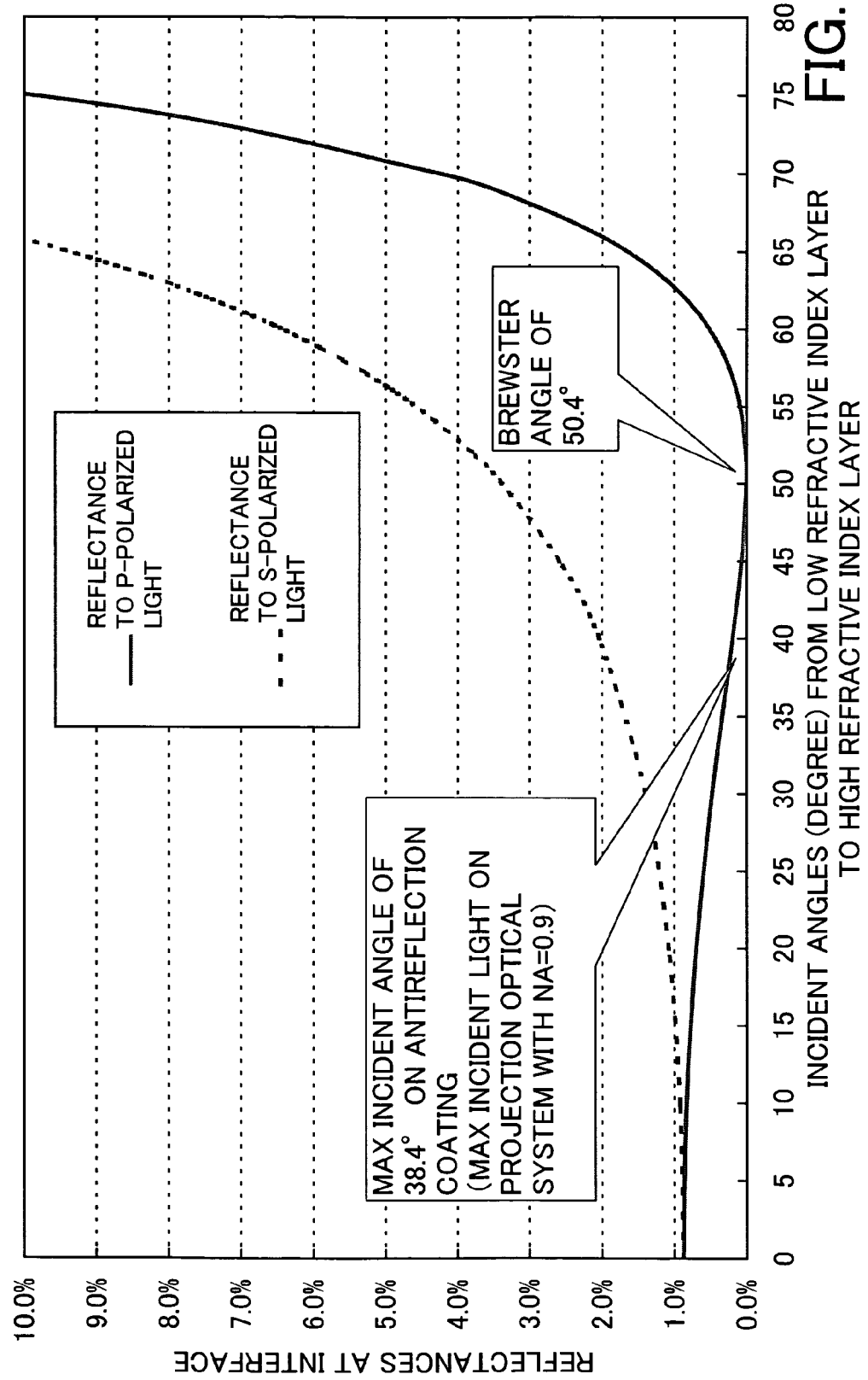
FIG. 9 is a graph showing the reflectances at an interface when the light enters a high refractive index layer from a low refractive index layer.

FIG. 9 shows the reflectances at an interface where the light enters a high refractive index layer from a low refractive index layer. In FIG. 9, an abscissa is an incident angle of the light that enters the high refractive index layer from the low refractive index layer, and an ordinate is the reflectance at the interface. Referring to FIG. 9, at the interface, the maximum incident angle is 38.4° and the Brewster angle is 50.4°.

Figure 10:
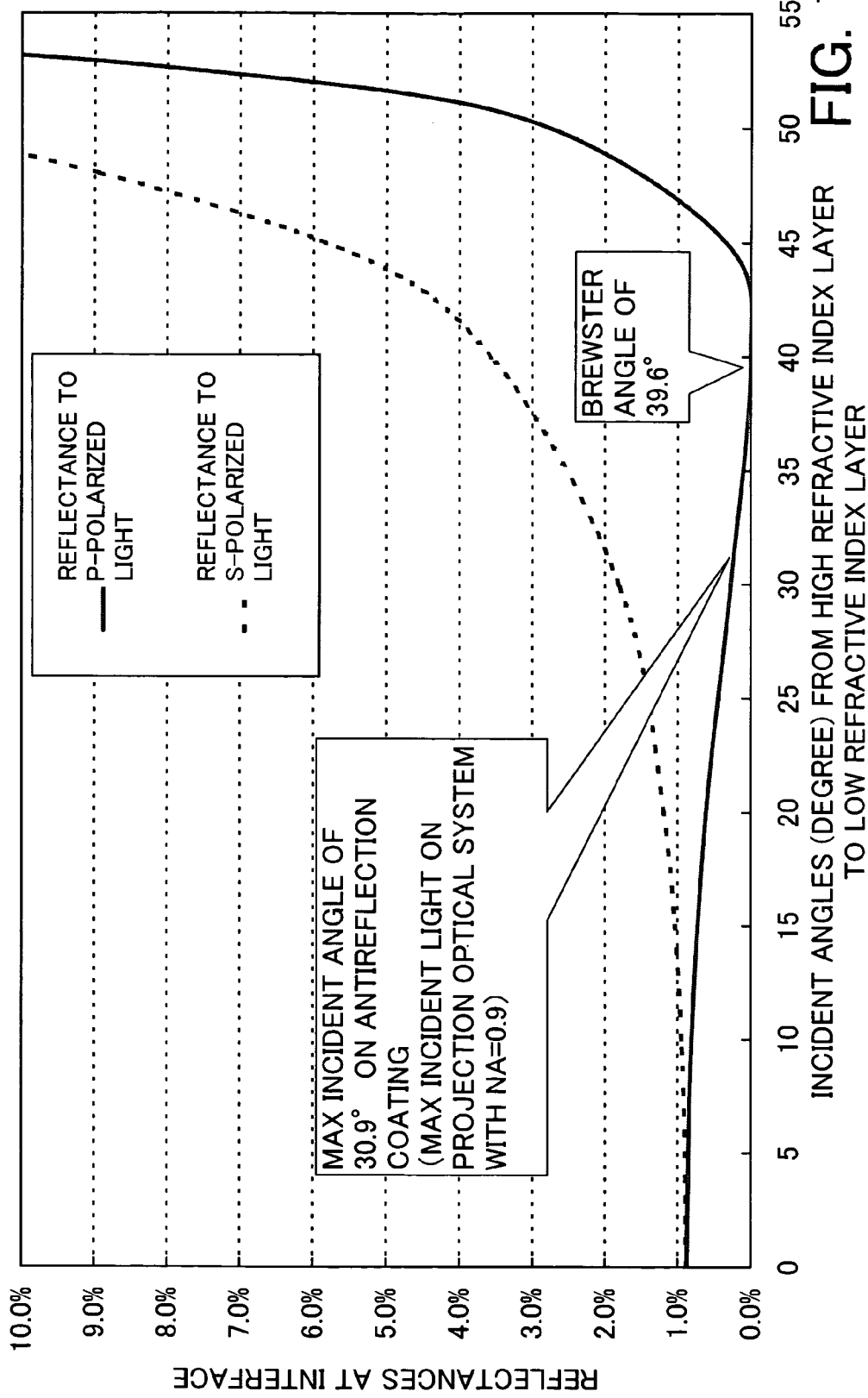
FIG. 10 is a graph showing the reflectance at an interface when the light enters a low refractive index layer from a high refractive index layer.

FIG. 10 shows the reflectance at an interface where the light enters a low refractive index layer from a high refractive index layer. In FIG. 10, an abscissa is an incident angle of the light that enters the low refractive index layer from the high refractive index layer, and an ordinate is the reflectance at the interface. Referring to FIG. 10, at the interface, the maximum incident angle is 30.9° and the Brewster angle is 39.6°.

Figure 11:
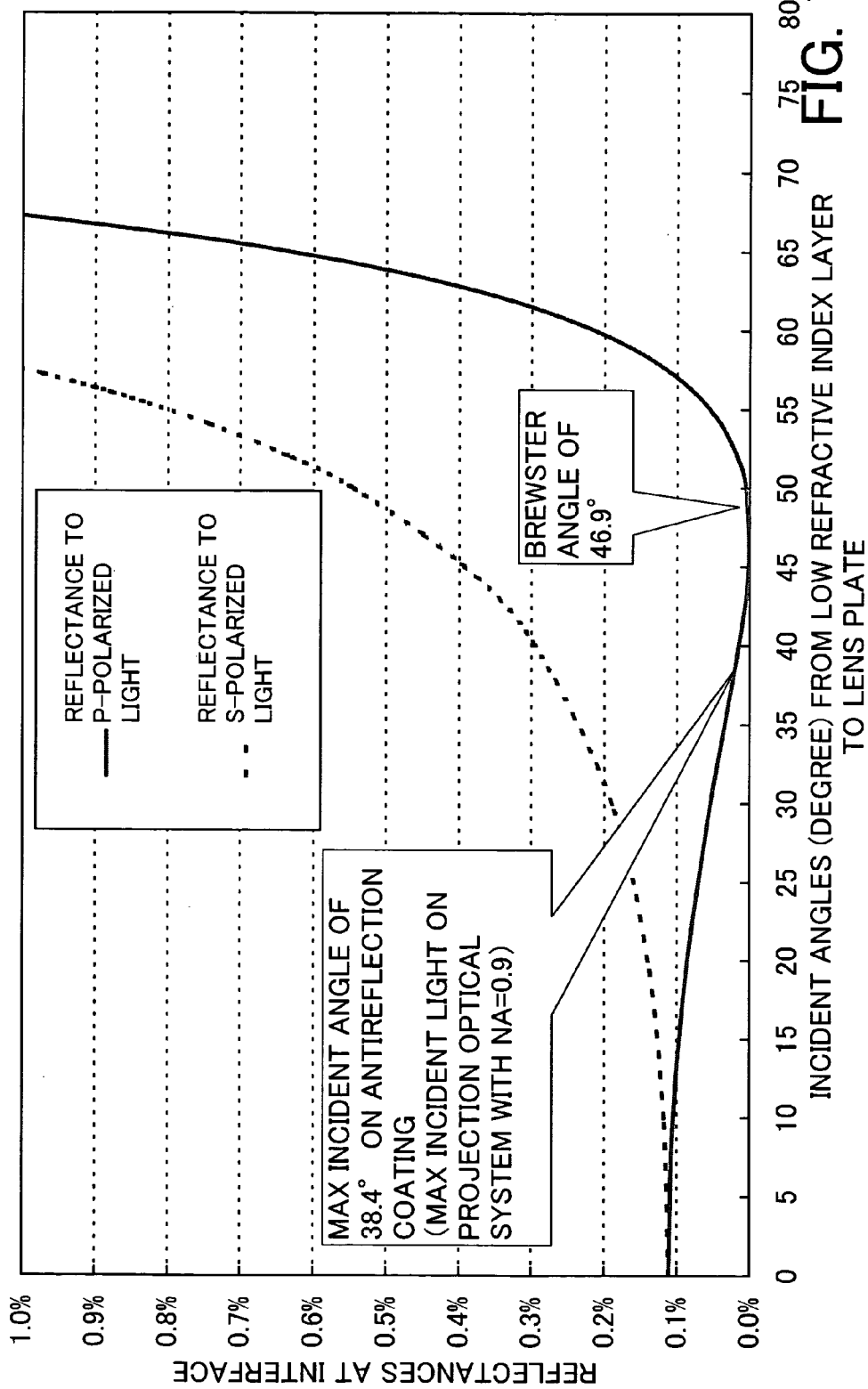
FIG. 11 is a graph showing the reflectance at an interface when the light enters a lens plate from a low refractive index layer.

FIG. 11 shows the reflectance at an interface where the light enters a lens plate from a low refractive index layer. In FIG. 11, an abscissa is an incident angle of the light that enters the lens plate from the low refractive index layer, and an ordinate is the reflectance at the interface. Referring to FIG. 11, at the interface, the maximum incident angle is 38.4° and the Brewster angle is 46.9°.

Figure 12:
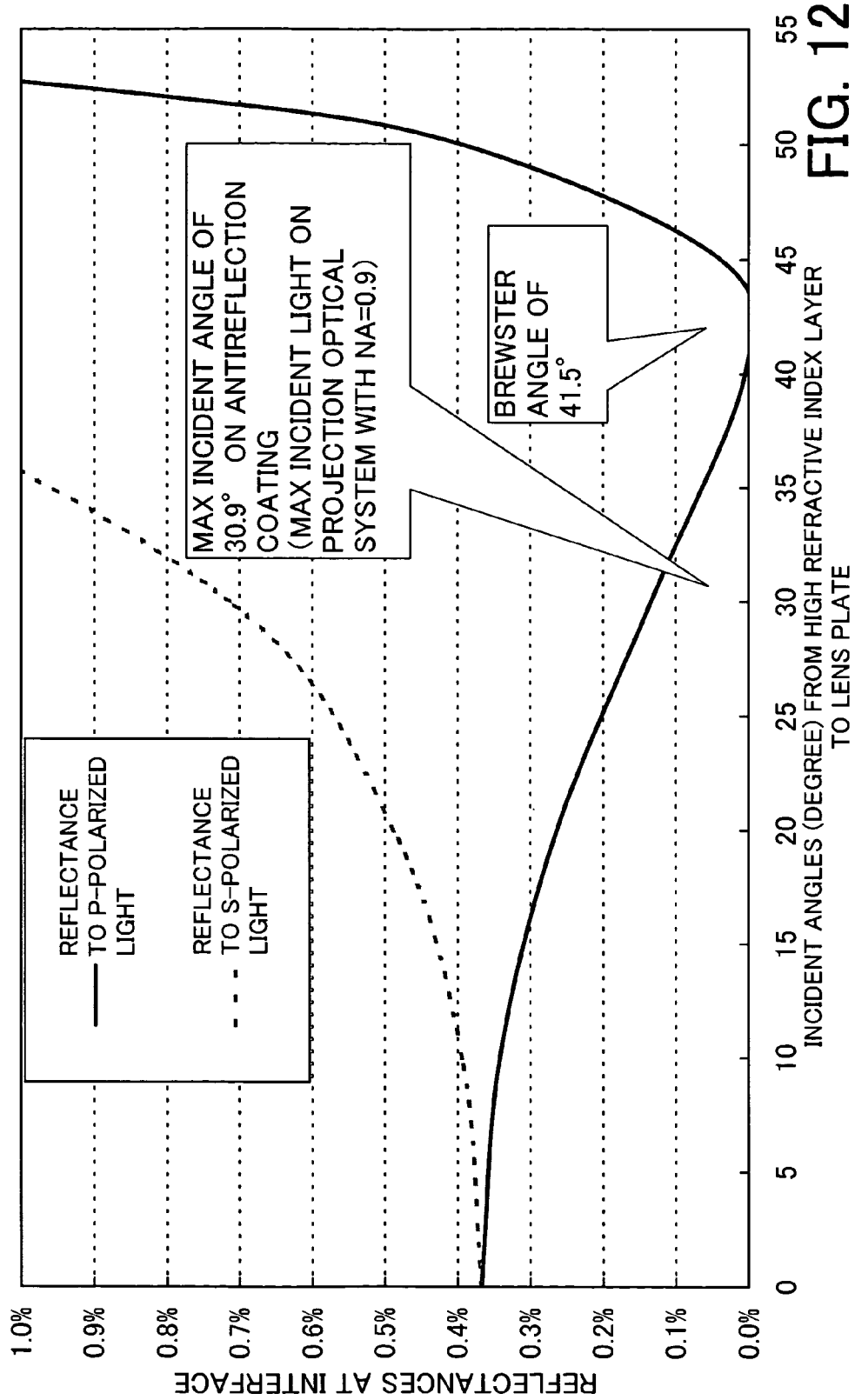
FIG. 12 is a graph showing the reflectance at an interface when the light enters a lens plate from a high refractive index layer.

FIG. 12 shows the reflectance at an interface when the light enters a lens plate from a high refractive index layer. In FIG. 12, an abscissa is an incident angle of the light that enters the lens plate from the high refractive index layer, and an ordinate is the reflectance at the interface. Referring to FIG. 12, at the interface, the maximum incident angle is 30.9° and the Brewster angle is 41.5°.

All of these four types of interfaces in the above antireflection coatings indicate that the maximum incident angle for the light with the NA=0.90 is smaller than the Brewster angle. Only the interface between the air and the final layer in the antireflection coating indicates that the maximum incident angle of the light with the NA=0.90 is greater than the Brewster angle. For comparison purposes, an incident angle at each interface is calculated when the light with a NA=0.65 (corresponding to an incident angle of 40°) enters the antireflection coating. The maximum incident angle of the interface is 40° when the light enters the low refractive index layer from the air. The maximum incident angle of the interface is 26.3° when the light enters the high refractive index layer from the low refractive index. The maximum incident angle of the interface is 21.5° when the light enters the low refractive index layer from the high refractive index. The maximum incident angle of the interface is 26.3° when the light enters the lens plate from the low refractive index. The maximum incident angle of the interface is 21.5° when the light enters the lens plate from the low refractive index.

When a ray has the maximum incident angle of NA=0.65, and enters the low refractive index layer from the air as shown in FIG. 8, the reflectance to the p-polarized light at the interface simply decreases in an incident light range between 0° and 40°. Similarly, when the ray enters the high refractive index layer or the lens plate from the low refractive index layer, as shown in FIGS. 9 and 11, the reflectance to the p-polarized light at the interface simply decreases in an incident light range between 0° and 26.3°. When the ray enters the low refractive index layer or the lens plate from the high refractive index layer as shown in FIGS. 10 and 12, the reflectance to the p-polarized light at the interface simply decreases in an incident light range between 0° and 21.5°.

In other words, the antireflection coating used in the projection optical system with a NA of 0.65 indicates a simple decrease in reflectance to the p-polarized light at each interface, and a simple increase in reflectance to the s-polarized light at each interface. From the reflective characteristic at the interface, the antireflection coating can maintain low the reflectances to the p-polarized light and the s-polarized light in an incident angle range from 0° to the maximum incident angle at each interface, by optimizing the number of layers and a thickness of each layer in the multilayer.

On the other hand, the antireflection coating used for the projection optical system with NA=0.90 follows a simple increase in reflectance to the s-polarized light at each interface, and a simple decrease in reflectance to the p-polarized light at the interfaces other than that between the air and the final layer. The reflectance on the final layer to the p-polarized light simply decreases up to the Brewster angle, but significantly increases beyond the Brewster angle. For such a reflective characteristic at the interface, even when the number of the layers and thickness in each layer are optimized in the multilayer, the reflectance for the final layer cannot be maintained low in the incident angle range beyond the Brewster angle.

As discussed, for example, in order to equalize the reflective characteristic of the antireflection coating used for the projection optical system with NA=0.90 to that of the antireflection coating used for the projection optical system with NA=0.65, it has been found necessary to provide the final layer with a high refractive index and with the Brewster angle of NA=0.90 or larger.

A description will now be given of an average reflectance to the p-polarized light and the s-polarized light of the antireflection coatings A and B shown in FIG. 4 to the incident angles. The antireflection coatings A and B make their final layer of a low refractive index layer with n=1.45, and thus the final layer has a Brewster angle of 55.4°.

Since the antireflection coatings A and B have the same refractive index n=1.45 of for their final layers, the antireflection coatings A and B have approximately similar average reflectances of 2.2% and 2.5%, respectively, to the p-polarized light and s-polarized light at the Brewster angle of 55.4°. In addition, the antireflection coatings A and B drastically increase the average reflectance to the p-polarized light and the s-polarized light beyond the Brewster angle of 55.4°, irrespective of different coating design values.

As discussed, it is well-known to structure the antireflection coating so that the final layer is the low refractive index layer. The low refractive index layer has a refractive index between about 1.40 and about 1.55. The Brewster angle determined by making the final layer the low refractive index layer is between about 55° and about 57° in a wave range of the KrF excimer laser (with a wavelength of approximately 248 nm), the ArF excimer laser (with a wavelength of approximately 193 nm), and the $F_2$ laser (with a wavelength of approximately 157 nm).

It is therefore understood that a conventional design of the antireflection coating (which makes the final layer a the low refractive index layer) is applicable without any problem to an exposure apparatus that includes a projection optical system with NA up to 0.8 (corresponding to the maximum incident angle of 53°), since an incident angle never exceeds the Brewster angle. However, in an exposure apparatus that includes a projection optical system with NA of 0.80 to 0.85 an incident angle may possibly exceeds a Brewster angle. In particular, an exposure apparatus that includes a projection optical system with NA of 0.85 or greater (corresponding to the maximum incident angle of 58°), an incident angle can exceed the Brewster angle as discussed and the conventional design of the antireflection coating is not applicable. Otherwise, the resolution would deteriorate due to the degraded CD uniformity and asymmetrical transfer pattern, etc.

Accordingly, the inventive antireflection coating 100 is applied, as shown in FIG. 1, to an optical element OM in a high-NA projection optical system with NA of 0.85 or greater so that Equation 2 below applies between the refractive index n of a final layer 112 in the multilayer 110 and the projection optical system's NA. The optical element OM is a light-transmitting member, such as a lens, a diffraction grating, a prism and a seal glass. The final layer 112 is a layer that contacts the air layer Ar, which can contain $O_2$, $CO_2$, $N_2$, He, $H_2O$, etc. in addition to the air. Here, FIG. 1 is a schematic sectional view of the antireflection coating 100 of one aspect according to the present invention.

$$\tan\{\sin^{-1}(0.85)\} \leq n \quad (2)$$

In other words, Equation 3 below applies between the refractive index n of a final layer 112 in the multilayer 110 in the antireflection coating 100.

$$1.6 \leq n \quad (3)$$

When a high index material is available to the antireflection coating 100 in a high-NA projection optical system with NA of 0.85 or greater, Equation 4 below applies preferably between the refractive index n of a final layer 112 in the multilayer 110 and the projection optical system's NA:

$$\tan\{\sin^{-1}(NA)\} \leq n \quad 0.85 \leq NA \quad (4)$$

Figure 2:
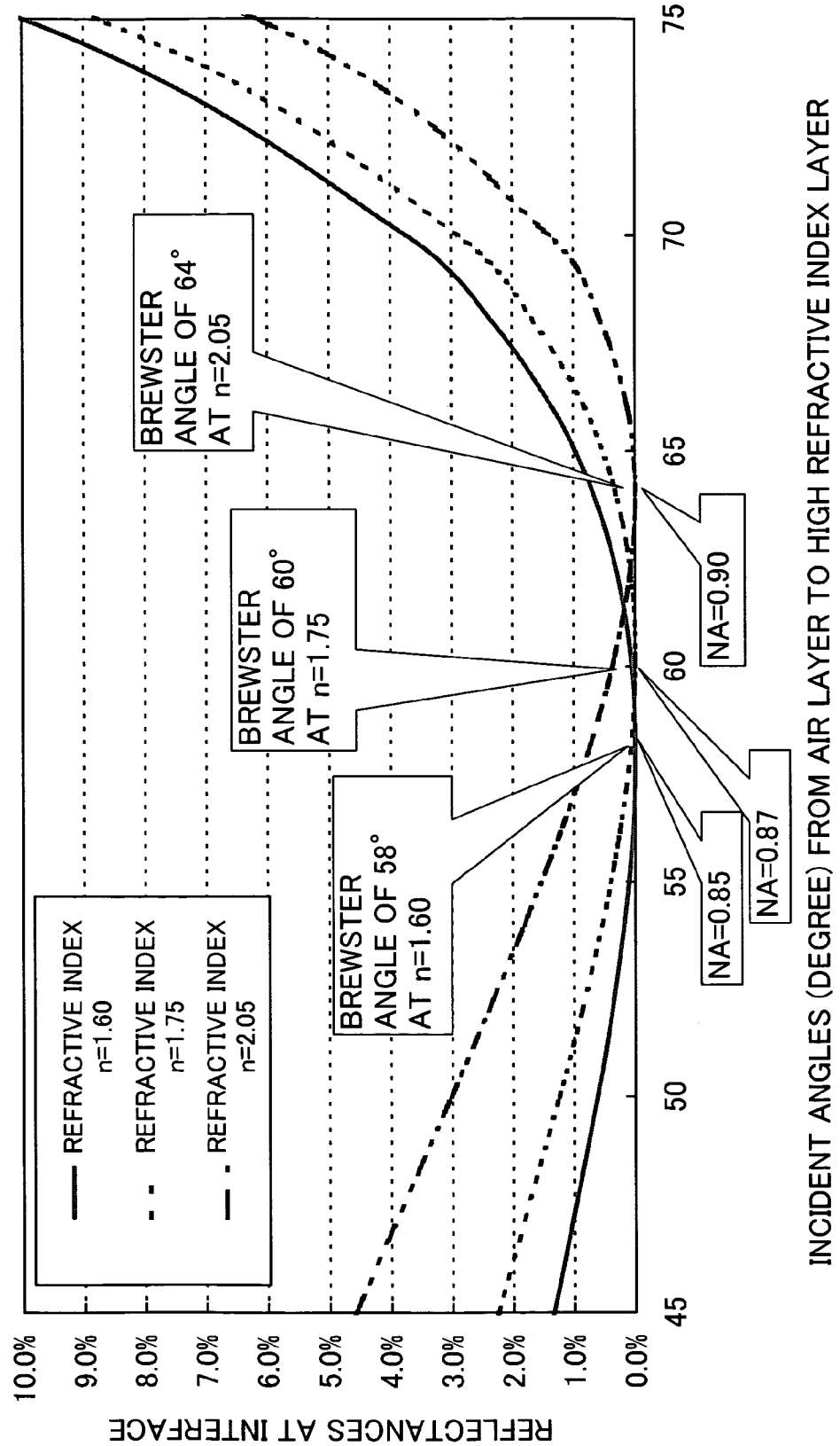
FIG. 2 is a graph showing a reflectance of a final layer in an antireflection coating to the p-polarized light when the light enters the final layer from an air layer.

FIG. 2 shows a reflectance of the final layer 112 to the p-polarized light when the light enters the final layer 112 in the antireflection coating 100 from the air layer Ar. In FIG. 2, an abscissa is incident angles of the light that enters the final layer 112 in the antireflection coating 100 from the air layer Ar, and an ordinate is reflectances on the final layer 112. FIG. 2 also shows the Brewster angle for each refractive index and the projection optical system's NA corresponding to the Brewster angle. The instant embodiment sets the refractive indexes of the final layer 112 in the antireflection coating 100 to 1.60, 1.75 and 2.05.

The antireflection coating shown in FIG. 4 has the final layer with a refractive index of 1.45. The Brewster angle is 55.4° when the light enters the final layer from the air layer. The PS average reflectance at the Brewster angle of about 55°, which is determined by this final layer, is maintained about 2.5% or smaller. Therefore, when the antireflection coating is designed so that the refractive index of the final layer has 1.6, 1.75 and 2.05 as shown in FIG. 2, the PS average reflectance can be maintained 2.5% or smaller at the Brewster angles around 58°, 60° and 64° corresponding to respective final layers' refractive indexes.

Since the maximum incident angles correspond to NA values of 0.85, 0.87 and 0.90 are 58°, 60° and 64°, respectively, the reflectance can be maintained small up to the maximum NA when the antireflection coating is used for the projection optical system with NA=0.85 or greater if the reflectance of the final layer in the antireflection coating 100 is selected according to the projection optical system's NA.

In other words, the optimized reflectance of the final layer can provide the projection optical systems with NA values of 0.85, 0.87 and 0.90, respectively, with antireflection coating characteristics as in the projection optical system that has a NA of 0.82 and uses the conventional optical thin film.

However, there is no high refractive index material with a refractive index of 2 or greater exists in the $F_2$ and ArF wave ranges, and it may be impossible to optimize the final layer's refractive index according to the projection optical system's NA. This case uses the thin film material that has the maximum refractive index available to that wavelength, such as one between 1.6 and 2.

When a projection optical system with NA=0.9 (corresponding to an incident angle of 64°) is used as an example, and the final layer uses a thin film material with a refractive index of 1.75, the Brewster angle becomes 60°, differing by 4° from the maximum incident angle of 64° at the NA of 0.9. Here, since the Brewster angle is 55° in FIG. 4 in which the final layer has a refractive index of 1.45), the PS average reflectance of 3.5% at 59° in FIG. 4 corresponds to the PS average reflectance at 64° when the refractive index is 1.75. When the present invention is used, the projection optical system with NA=0.9 can obtain the antireflection coating characteristics equivalent with those of the projection optical system that has a NA of 0.86 and uses a conventional optical thin film.

In using the inventive antireflection coating 100 for a high-NA projection optical system with a NA of 0.85 or greater, it is not-necessary to apply it to light-transmitting surfaces on all the optical elements. Rather, the antireflection coating 100 may be applied only to a surface on which the maximum incident angle of light upon the optical element exceeds a NA of 0.85 (corresponding to 87°). A single layer film is applicable. The antireflection coating 100 exhibits similar effects even when the air layer Ar is replaced with $N_2$, He, and another gas.

While the above description addresses the antireflection coating (or optical thin film) used for an optical element in a high-NA projection optical system, the present invention is effective as a photoresist for transferring a pattern.

Figure 13:
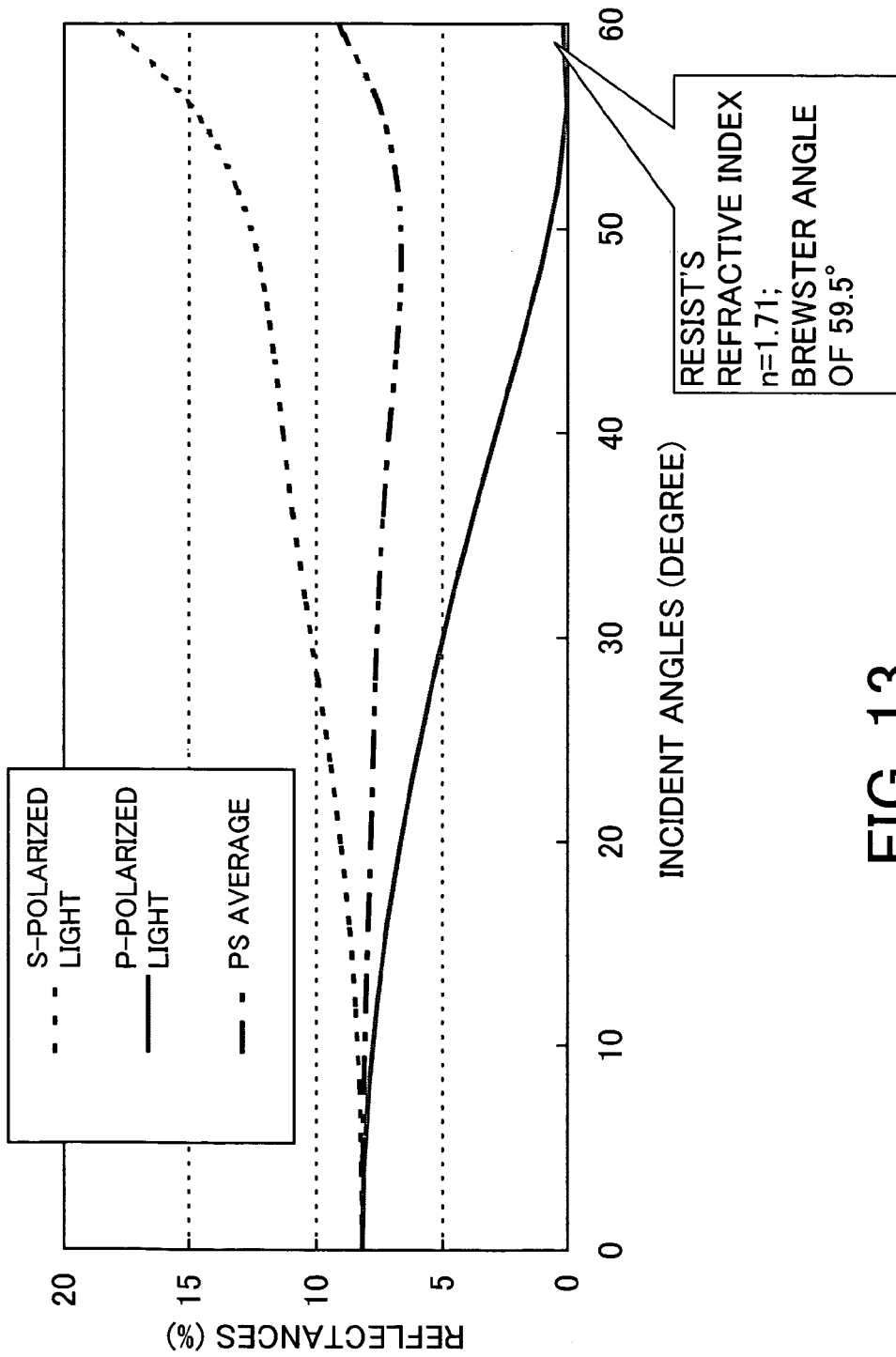
FIG. 13 is a graph showing incident angle dependencies of the reflectance to light incident upon a photoresist-applied wafer.

FIG. 13 shows the incident angle dependency of reflectance to the light incident upon a photoresist-applied wafer. In FIG. 13, an abscissa is the incident angle of the light upon the photoresist, and an ordinate is the reflectance. The photoresist application process generally applies the antireflection coating to the wafer and then applies the resist so as to reduce the reflections from a wafer substrate. Since the positive working resist generally has a high refractive index, for example, about 1.73, (although the photoresist in FIG. 13 has a refractive index of 1.71), the Brewster angle becomes about 60°. It is therefore possible to reduce the average reflectance between the p-polarized light and the s-polarized light down to 10% or smaller in a wide incident angle range between 0° and 60°. Without an antireflection coating, the average reflectance between the p-polarized light and the s-polarized light may reach about 40% depending upon a thickness of the photoresist.

Therefore, the inventive photoresist is effective when the projection optical system's NA becomes 0.85 (corresponding to the maximum incident angle of 58°) or greater. The photoresist 200 is applied, as shown in FIG. 14, onto a wafer WP so that Equation 5 below is met between the refractive index n' of the photoresist 200 and the projection optical system's NA. Here, FIG. 14 is a schematic sectional view of the photoresist 200 of another aspect according to the present invention.

$$\tan\{\sin^{-1}(0.85)\} \leq n' \quad (5)$$

In other words, the refractive index n' of the photoresist 200 satisfies Equation 6 below:

$$1.6 \leq n' \quad (6)$$

Figure 14A:
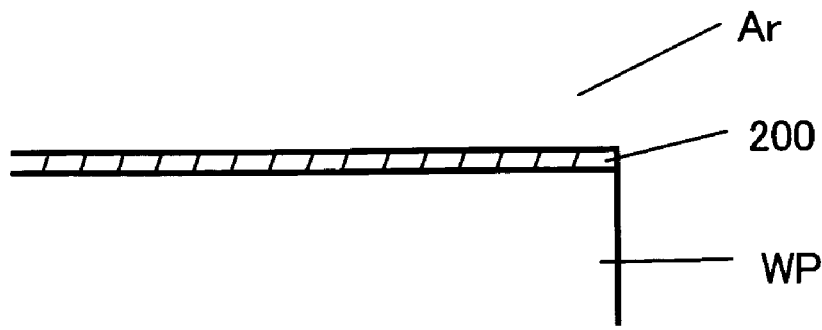
FIG. 14 is a schematic sectional view of a photoresist as one aspect according to the present invention.

FIG. 14A directly applies the photoresist 200 onto the wafer WP, and the photoresist 200 satisfies Equations 5 and 6.

Figure 14B:
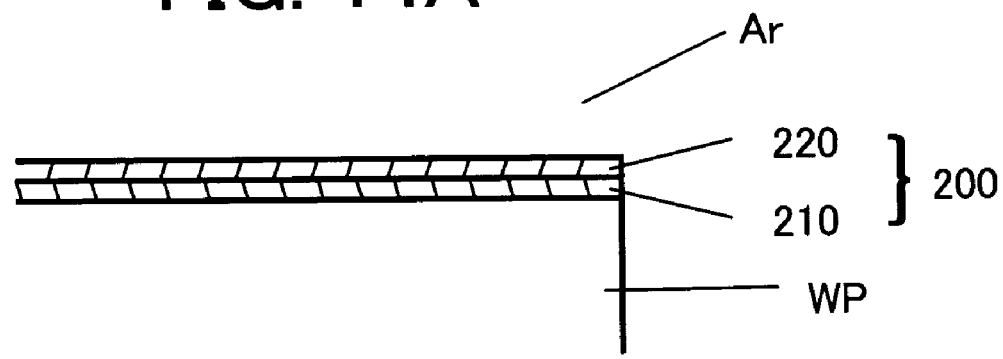

FIG. 14B applies the antireflection coating 210 onto the wafer WP, and then applies a resist layer 220 to form the photoresist 200. In this case, the uppermost layer in the resist layer 220 (which is a layer that is arranged closest to the light incident side and contacts the air layer Ar) satisfies Equations 5 and 6.

Figure 14C:
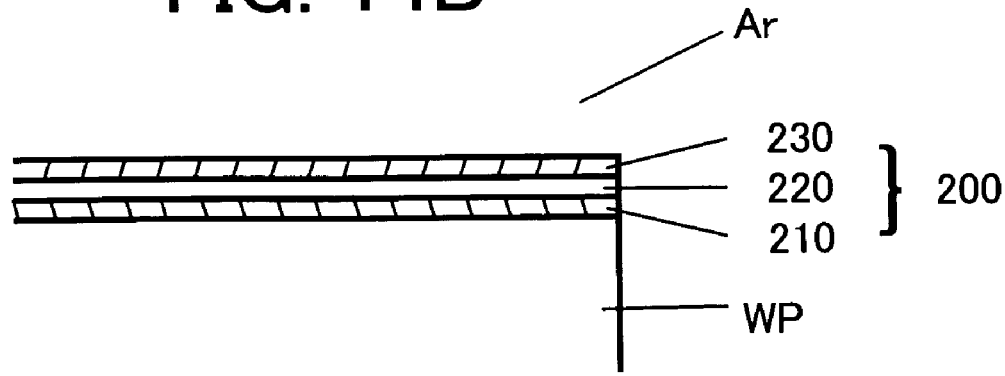

Alternatively, the antireflection coating 210 is applied onto the wafer WP, then the resist layer 220 is applied, and a top layer 230 that satisfies Equations 5 and 6, as shown in FIG. 14C. In this case, the top layer 230 does not exhibit a resist characteristic, and may be a light-transmitting layer of a high refractive index. After exposure, the top layer 230 of the high refractive index is peeled off, and a usual development process is conducted for the resist layer 220. Of course, as long as the top layer 230 dissolves in the usual developer, the top layer 230 does not have to be peeled off. This case requires the top layer in the photoresist 200 applied onto the wafer WP, which contacts the air layer Ar, to satisfy Equations 5 and 6. The photoresist 200 exhibits similar effects even when the air layer Ar is replaced with gasses, such as $N_2$ and He.

When a high index material is available to the photoresist 200, Equation 7 below is preferably met between the refractive index n' of a layer that contacts the air layer Ar in the photoresist 200 and the NA of a projection optical system with a high NA of 0.85 or greater:

$$\tan\{\sin^{-1}(NA)\} \leq n' \quad 0.85 \leq NA \quad (7)$$

Thus, the inventive antireflection coating 100 and/or photoresist 200 can provide a projection optical system having a NA of 0.85 or greater with antireflection characteristics, and realize an exposure apparatus that improves the CD uniformity and pattern symmetry.

Figure 15:
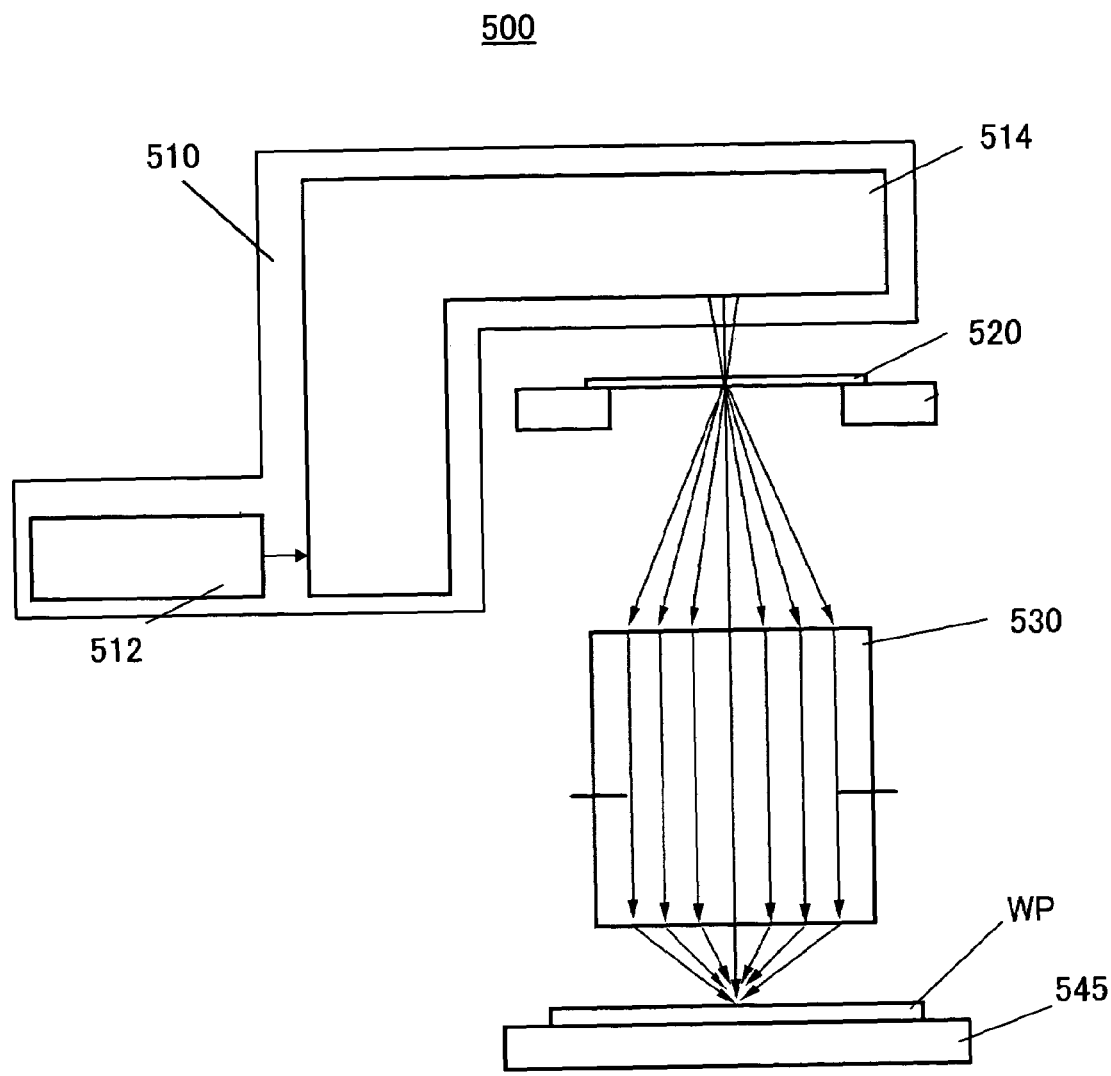
FIG. 15 is a schematic structure of an exposure apparatus as one aspect according to the present invention.

Referring to FIG. 15, a description will now be given of an exposure apparatus 500 that includes a projection optical system 530 that has an optical element onto which the inventive antireflection coating 100 is applied. FIG. 15 is a schematic structure of the exposure apparatus 500 of one aspect according to the present invention. The exposure apparatus 500 includes, as shown in FIG. 15, an illumination apparatus 510, a projection optical system 530 that projects diffracted light generated from an illuminated reticle pattern onto the wafer WP, and a wafer stage 545 for supporting the wafer WP.

The exposure apparatus 500 is a projection exposure apparatus that exposes onto the wafer WP a circuit pattern on the reticle 520, for example, in a step-and-repeat or a step-and-scan manner. Such an exposure apparatus is suitable for a submicron or quarter-micron lithography process, and this embodiment exemplarily describes a step-and-scan exposure apparatus (which is also called "a scanner").

The illumination apparatus 510 illuminates the reticle 520 that forms a circuit pattern to be transferred, and includes a light source unit 512 and an illumination optical system 514.

The light source unit 512 uses as a light source, for example, an ArF excimer laser with a wavelength of approximately 193 nm, and a KrF excimer laser with a wavelength of approximately 248 nm. The type of the light source is not limited to the excimer laser, and can use a $F_2$ excimer laser with a wavelength of approximately 153 nm. The number of laser units is not limited. An optical system for reducing speckles may swing linearly or rotationally. When the light source unit 512 uses a laser, it is desirable to employ a beam shaping optical system that shapes a parallel beam from a laser source to a desired beam shape, and an incoherently turning optical system that turns a coherent laser beam into an incoherent one. A light source applicable to the light source unit 512 is not limited to a laser, and may use one or more lamps such as a mercury lamp and a xenon lamp.

The illumination optical system 514 is an optical system that illuminates the reticle 520, and includes a lens, a mirror, an optical integrator, a stop, and the like, arranging, for example, a condenser lens, a fly-eye lens, an aperture stop, a condenser lens, a slit, and an imaging optical system in this order. The illumination optical system 514 can use any light whether it is on-axial or off-axial light. The optical integrator may include a fly-eye lens or an integrator formed by stacking two sets of cylindrical lens array plates (or lenticular lenses), and may be replaced with an optical rod or a diffractive element.

The reticle 520 is made from quartz, for example, forms a circuit pattern (or an image) to be transferred, and is supported and driven by a reticle stage (not shown). Diffracted light emitted from the reticle 520 passes through the projection optical system 530, thus and then is projected onto the wafer WP. The reticle 520 and the wafer WP are located in an optically conjugate relationship. Since the exposure apparatus 500 of this embodiment is a scanner, the reticle 520 and the wafer WP are scanned at a speed ratio of a reduction ratio of the projection optical system 530, thus transferring the pattern on the reticle 520 to the wafer WP. If it is a step-and-repeat exposure apparatus (referred to as a "stepper"), the reticle 520 and the wafer WP remain still for exposure.

The projection optical system 530 projects light that reflects a pattern on the reticle 520 as an object surface onto the wafer WP as an image surface, and has a NA of 0.85. Any necessary correction of the chromatic aberration can use a plurality of lens units made from glass materials having different dispersion values (Abbe values), or can arrange a diffractive optical element such that it disperses in a direction opposite to that of the lens element.

The inventive antireflection coating 100 is applied to an optical element as a lens in the projection optical system 530. The antireflection coating 100 can reduce scattering of transmittance in the projection optical system 530 with even a NA of 0.85 or greater, and provide resolution with the excellent CD uniformity and pattern symmetry.

The wafer WP can be a liquid crystal plate and another object to be exposed. The photoresist is applied onto the wafer WP. This photoresist can use the inventive photoresist 200, thereby reducing reflections of the exposure light on the wafer WP and transferring the pattern on the reticle 520 with excellent resolution.

The wafer stage 545 supports the wafer WP. The wafer stage WP may use any structure known in the art, and a detailed description of its structure and operation is omitted. The stage 545 may use, for example, a linear motor to move the wafer WP in XY directions. The reticle 520 and wafer WP are, for example, scanned synchronously, and the positions of the wafer stage 545 and a reticle stage (not shown) are monitored, for example, by a laser interferometer and the like, so that both are driven at a constant speed ratio. The wafer stage 545 is installed on a stage stool supported on the floor and the like, for example, via a damper. The reticle stage and the projection optical system 530 are installed on a lens barrel stool (not shown) supported, for example, via a damper to the base frame placed on the floor.

In exposure, light emitted from the light source unit 512, e.g., Koehler-illuminates the reticle 520 via the illumination optical system 514. Light that passes through the reticle 520 and reflects the reticle pattern is imaged onto the wafer WP by the projection optical system 530. A material that satisfies Equation 4 is selected for the antireflection coating applied onto an optical element in the projection optical system 530 in the exposure apparatus 500, and arranged closest to the incident side of the exposure light. Thus, the exposure apparatus 500 can provide high-quality devices (such as semiconductor devices, LCD devices, photographing devices (such as CCDs, etc.), thin film magnetic heads, and the like). Similarly, a material that satisfies Equation 7 is selected for the photoresist applied onto the wafer WP in the exposure apparatus 500, and arranged closest to the incident side of the exposure light.

Figure 16:
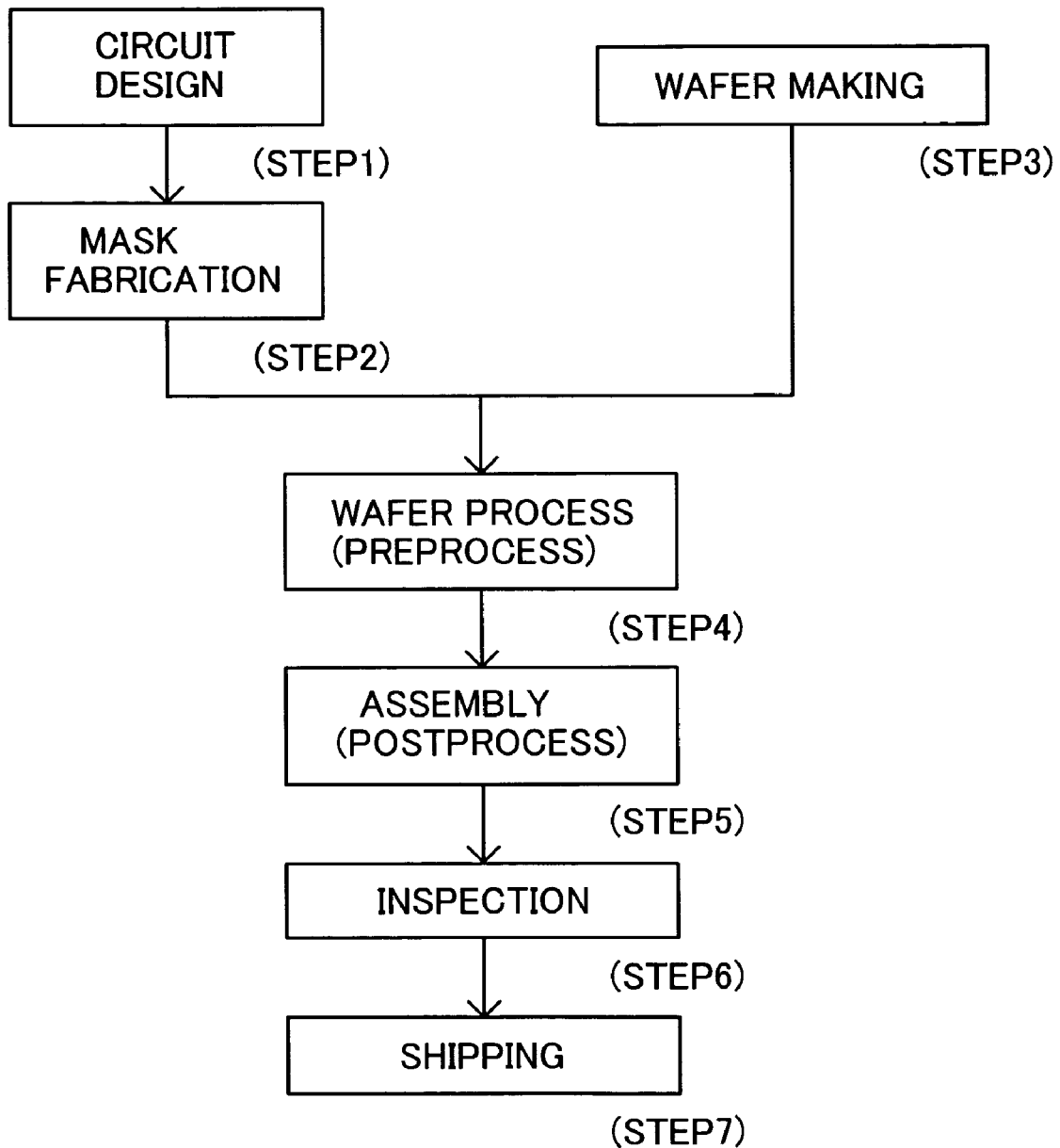
FIG. 16 is a flowchart for explaining how to fabricate devices (such as semiconductor chips such as ICs and LCDs, CCDs, and the like).
Figure 17:
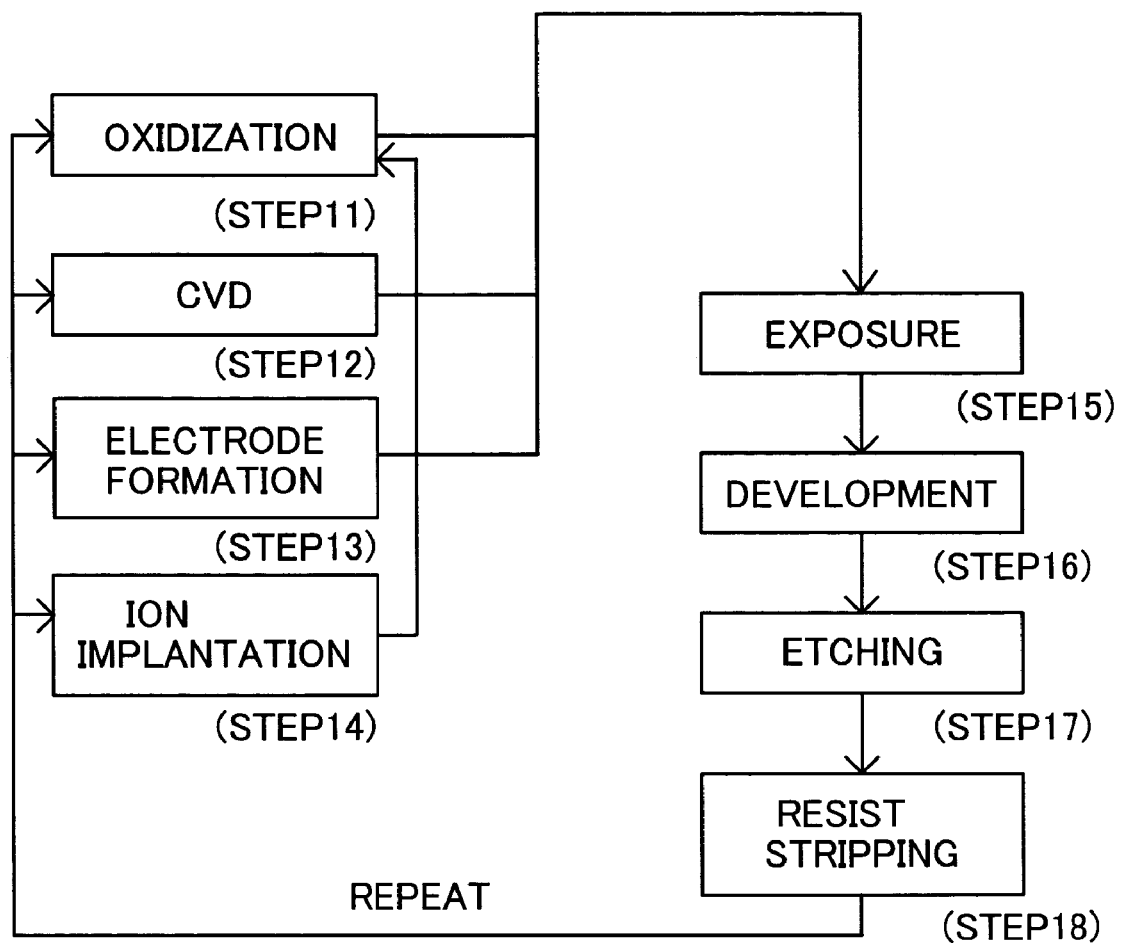
FIG. 17 is a detail flowchart of a wafer process as Step 4 shown in FIG. 16.

Referring now to FIGS. 16 and 17, a description will be given of an embodiment of a device fabrication method using the above exposure apparatus 500. FIG. 16 is a flowchart for explaining a fabrication of devices (i.e., semiconductor chips such as IC and LSI, LCDs, CCDs, etc.). A description will now be given of a fabrication of a semiconductor chip, as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding) ., a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 17 is a detailed flowchart of the wafer process in Step 4 in FIG. 16. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (exposure) applies the photosensitive material described in the above embodiments onto the wafer, and uses the exposure apparatus 500 to expose a circuit pattern on the mask onto the wafer. Step 16 (development) develops the exposed wafer. Step 17 (etching) etches parts other than a developed resist image. Step 18 (resist stripping) removes the disused resist after etching. These steps are repeated, and multilayer circuit patterns are formed on the wafer. This fabrication method can manufacture higher quality devices than the conventional ones. Thus, the device fabrication method that uses the exposure apparatus 500 and the device as resultant products constitute one aspect according to the present invention.

Further, the present invention is not limited to these preferred embodiments, but various modifications and variations may be made without departing from the spirit and scope of the present invention. For example, the inventive antireflection coating is applicable to the optical element in the illumination optical system having a NA of 0.85 or higher.

Thus, the present invention can provide a novel and high-NA projection optical system that has excellent optical performance, such as throughput and resolution.

What is claimed is:

1. A projection optical system that projects a pattern on a first surface onto a second surface, and has a numerical aperture of 0.85 or higher, said projection optical system comprising:
   an optical element; and
   an antireflection coating applied to said optical element, said antireflection coating including plural layers, an end layer that contacts an air, said end layer having a refractive index of tan $\{\sin^{-1} (NA)\}$ or greater, where NA is the numerical aperture of the projection optical system.

2. A projection optical system according to claim 1, wherein the refractive index is 1.6 or greater.

3. A projection optical system according to claim 1, wherein said optical element is a light-transmitting element.

4. A projection optical system according to claim 1, wherein said optical element is one of a lens, a diffraction grating, a prism and a seal glass.

5. A projection optical system according to claim 1, wherein said optical element is the closest to the second surface in said projection optical system.

6. An exposure apparatus comprising a projection optical system and exposing an object by irradiating light onto the object through the projection optical system,
   wherein said projection optical system that projects a pattern on a reticle onto the object, and has a numerical aperture of 0.85 or higher, said projection optical system comprising:
   an optical element; and
   an antireflection coating applied to said optical element, said antireflection coating including plural layers, an end layer that contacts an air, said end layer having a refractive index of tan $\{\sin^{-1} (NA)\}$ or greater, where NA is the numerical aperture of the projection optical system.

7. An exposure apparatus according to claim 6, wherein the light has a wavelength of 250 nm or smaller.

8. An exposure method for exposing an object using an exposure apparatus that includes a projection optical system with a numerical aperture of 0.85 or higher, said method comprising the step of:

forming a multilayer on the object, said multilayer including a photoresist layer, and the multilayer having an uppermost layer that contacts an air, said uppermost layer having a refractive index of tan $\{\sin^{-1} (NA)\}$ or higher; and exposing the object using the exposure apparatus.

9. An exposure method according to claim 8, wherein the uppermost layer is a resist layer.

10. An exposure method according to claim 8, wherein the uppermost layer is a light-transmitting layer.

11. A device fabrication method comprising the steps of: exposing an object using an exposure apparatus; and developing the object that has been exposed, wherein said exposure apparatus comprising a projection optical system, and exposing the object by irradiating light onto the object through the projection optical system, wherein said projection optical system that projects a pattern on a reticle onto the object, and has a numerical aperture of 0.85 or higher, said projection optical system comprising:

an optical element; and an antireflection coating applied to said optical element, said antireflection coating including plural layers, an end layer that contacts an air, said end layer having a refractive index of tan $\{\sin^{-1} (NA)\}$ or greater, where NA is the numerical aperture of the projection optical system.

* * * * *